April 26, 1960 L. L. DEER 2,934,479

PROCESS FOR MASKING PRINTED CIRCUITS BEFORE PLATING

Filed Jan. 22, 1957

INVENTOR.
LEON L. DEER
BY
[signature]
ATTORNEYS

United States Patent Office 2,934,479

Patented Apr. 26, 1960

2,934,479

PROCESS FOR MASKING PRINTED CIRCUITS BEFORE PLATING

Leon L. Deer, Indianapolis, Ind., assignor to the United States of America as represented by the Secretary of the Navy Application January 22, 1957, Serial No. 635,554

2 Claims. (Cl. 204—15)

(Granted under Title 35, U.S. Code (1952), sec. 266)

The invention described herein may be manufactured and used by or for the Government of the United States of America for governmental purposes without the payment of any royalties thereon or therefor.

The present invention relates to printed circuit boards and more particularly to a method for masking printed circuit boards prior to plating various metals thereon.

The electronic industry is finding increased use for printed circuitry as these circuits have several distinct advantages over the standard process of connecting electrical components with hook-up wire. Foremost among the advantages are the compact design of the units and the decreased cost of production due to the elimination of the arduous task of wiring components in circuit, as heretofore required by the standard method of making electronic assemblies.

The printed circuits presently being produced are usually a conductive pattern on an insulating support and are made by etching or otherwise removing the unwanted surface area, leaving a foil pattern. The basic material used is normally a metal clad base material, such as copper foil bonded to one or both sides of a laminated plastic material. However, in many cases, a bare copper circuit does not have sufficient abrasion or corrosion resistance, or solderability for the particular application, and, consequently, one or more metals may be plated onto the copper to provide increased serviceability. Oftentimes it may be desirable to electroplate silver or other precious metal onto the copper pattern and to electroplate a hard metal such as nickel or rhodium, or both, onto those areas that are subjected to wear, such as contact points.

The present invention provides an improved method of plating one or more metals onto the conductive pattern of a printed circuit board by using a polyvinyl chloride coating that can be deposited on top of an acid resist material and then later be removed without removing the resist. Thus only one screening-on of the resist is required, yet allowing multiple plating operations to be performed.

It is therefore a general object of the present invention to provide an improved method of plating metals on printed circuit boards by providing a nonmetallic coating that can be deposited over a printed resist material and then later be removed without removing the resist.

Other objects and many of the attendant advantages of this invention will be readily appreciated as the same becomes better understood by reference to the following detailed description when considered in connection with the accompanying drawing wherein.

Figure 1:
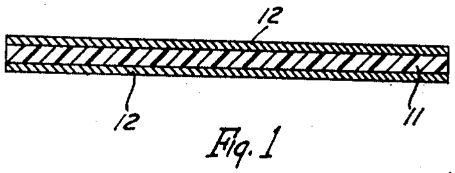
Figure 1 is a sectional view showing metal clad base material for use in making printed circuit boards.

Referring now to the drawing, wherein like reference characters designate like or corresponding parts throughout the several views, there is shown in Figure 1 of the drawing a typical metal clad base material consisting of an insulating base 11 and a thin layer of metallic material 12, such as copper, bonded to each side of the insulating base 11. The insulating material might be a laminated plastic, such as a glass base epoxy, melamine, silicone or Teflon. Also metal foils other than copper can be used, such as aluminum or brass.

Figure 2:
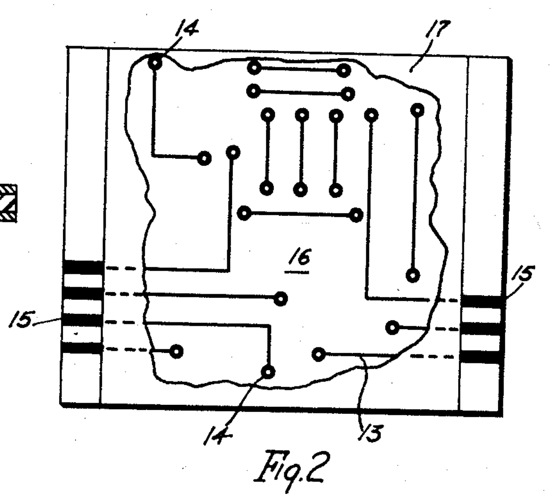
Figure 2 is a plan view, partially broken away, showing a printed pattern of resist on metal clad base material.

Referring now to Figure 2 of the drawing, there is shown a printed circuit board on which there is printed a design pattern having various connector strips 13, terminal circles 14, and contacts 15. The design pattern can be applied by any conventional method well-known in the art, as by printing with an acid resist on the metal surface 16. By way of example, a coating of polyvinyl chloride 17 is applied, as by brushing or spraying, to the center portion of the printed circuit board, and the contacts 15 might then be plated with nickel and/or rhodium to provide a surface that will withstand abrasion. The coating of polyvinyl chloride 17 prevents the deposition of the electroplate on all areas that the coating covers, and thus it can be seen that expensive metals, such as rhodium, are deposited only on those surfaces that are subjected to wear and need to be protected. The polyvinyl chloride coating 17 can then be stripped off the center portion and another coating can be applied to cover the electroplated contacts 15, and the center portion can then be given a different plating, such as tin. The polyvinyl chloride coating will prevent any additional plating on those surfaces already plated. Thus it can be seen that multiple plating operations can be performed and that the particular metals will be deposited only on the desired surfaces.

Unplasticized polyvinyl chloride is a hard, horny material that is insoluble in most solvents, nonflammable, nontoxic, odorless, and tasteless, and as such is not in suitable form to be used as a coating material. Accordingly, the polyvinyl chloride is made suitable for use by converting it into a plastisol, which is a vinyl dispersion in a nonaqueous liquid in which the liquid phase consists only of plasticizer.

The resins used for dispersions are polymers of vinyl chloride and are prepared by emulsion polymerization to attain small particle size. The suitable particle size ranges from 0.02 to 2 microns in diameter; however, the larger particles are preferred for plastisols as they provide greater fluidity and better viscosity stability with equivalent proportions of plasticizer. The plasticizer might be one of many well known in the art, such as a phthalate ester, a phosphate ester, a sebacate ester, or the like.

Figures 3, 4:
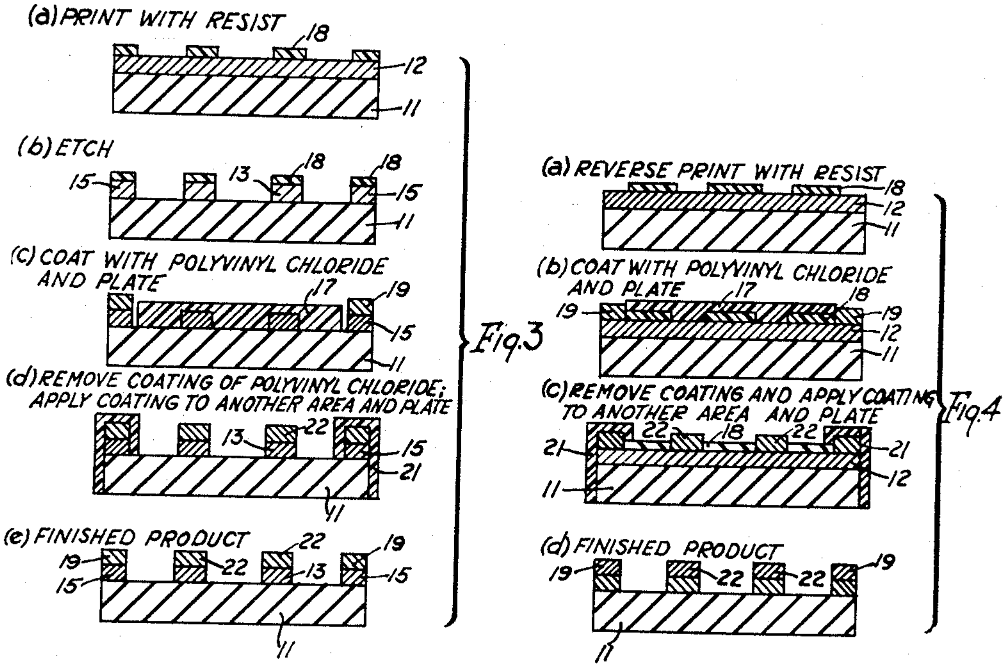
Figure 3 shows on step-by-step production method of plating the conductive pattern of a printed circuit board.
Figure 4 shows another step-by-step method of plating the conductive pattern of a printed circuit board.

Referring now to Figure 3 of the drawing, there is shown a sequence of operations involved in electroplating a printed circuit board in which the desired conductive pattern is first printed with an acid resist 18 on the metallic material 12. Next the board is etched in acid whereby the unwanted metal is removed, leaving the desired conductive pattern under the resist. The resist can then be removed and portions of the pattern can then be coated with polyvinyl chloride 17 and then plated, as shown in Figure 3*c*. By way of example, the first plating might be nickel or rhodium 19 on contacts 15, in order to increase their abrasion resistance. As shown in Figure 3*d*, the first coating of polyvinyl chloride 17 is removed and a new coating 21 is applied over the plated contacts 15. The remaining pattern can then be plated, and by way of example the second plating might be either silver or tin-lead 22. The finished product is shown in Figure 3*e*, wherein two different metals have been electroplated on the pattern to provide the desired properties.

Another method of producing printed circuit boards is shown in Figure 4 of the drawing wherein the metallic material is first reverse printed with a resist, that is, those areas that are to be etched away are printed with the resist 18. Next, as shown in Figure 4*b*, a coating of polyvinyl chloride 17 is applied to a portion of the board and a first plate such as nickel or rhodium 19 is applied. Next, as shown in Figure 4*c*, the coating of polyvinyl chloride is removed and another coating of polyvinyl chloride 21 is applied, as by brushing or spraying, to the plated surfaces. A different material 22, such as silver or lead-tin, is then electrodeposited on the metallic material 12. The resist and polvinyl chloride coating 21 are next removed, and then the board is placed in an etching solution which does not attack the electroplated materials, but removes the unwanted portion of the metallic material 12, leaving the desired conductive pattern.

The use of polyvinyl chloride as a coating material is particularly desirable as it not only prevents the deposition of the plating metals on the surfaces that it covers, but it can be applied directly over the resist and when the polyvinyl chloride coating is stripped off the resist pattern remains intact. This permits the entire conductive pattern to be printed in one operation, rather than multiple operations, and thus is less expensive and produces a better finished product in that there is no chance of misalignment as in the case of multiple printing operations.

Obviously many modifications and variations of the present invention are possible in the light of the above teachings. It is therefore to be understood that the invention may be practiced otherwise than as specifically described.

What is claimed is:

1. The method of making a printed circuit board comprising, reverse printing with a material resistant to electroplating a conductive pattern on a board of metal clad base material, coating with polyvinyl chloride a portion of the surface of said board, electroplating said uncoated portion with a first metal, removing said polyvinyl chloride coating and then applying another coating of polyvinyl chloride to the electroplated portion, then electroplating said uncoated portion of said board with a metal different from said first metal, next removing said polyvinyl chloride coating and said material resistant to electroplating, and then etching in a solution which does not attack said electroplating thereby producing a conductive pattern on said board.

2. The method of claim 1 wherein said polyvinyl chloride is in plastisol form.

References Cited in the file of this patent

UNITED STATES PATENTS

| | | |
|---|---|---|
| 1,862,231 | McFarland | June 7, 1932 |
| 2,651,871 | Lynden | Sept. 15, 1953 |
| 2,702,252 | Suchoff | Feb. 15, 1955 |
| 2,834,723 | Robinson | May 13, 1958 |
| 2,861,029 | Bain et al. | Nov. 18, 1958 |
| 2,872,391 | Hauser et al. | Feb. 3, 1959 |

FOREIGN PATENTS

| | | |
|---|---|---|
| 661,273 | Great Britain | Nov. 21, 1951 |

OTHER REFERENCES

"Copper-Clad Phenolite," pub. by National Vulcanized Fibre Co., Wilmington 99, Delaware, rec'd. Oct. 9, 1956; pages 4, 5 and 7.

Electrical Mfg., February 1956, pages 129–131.